(12) United States Patent
Lu et al.

(10) Patent No.: US 8,263,994 B2
(45) Date of Patent: Sep. 11, 2012

(54) LED PACKAGE

(75) Inventors: Ying-Chieh Lu, Miao-Li Hsien (TW); Kuo-Feng Chiang, Miao-Li Hsien (TW); Zheng-Jay Huang, Miao-Li Hsien (TW); Kuo-Mang Lo, Miao-Li Hsien (TW); Hsin-Fei Huang, Miao-Li Hsien (TW); Yu-Shu Chen, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 43 days.

(21) Appl. No.: 12/905,094

(22) Filed: Oct. 15, 2010

(65) Prior Publication Data

US 2012/0037936 A1  Feb. 16, 2012

(30) Foreign Application Priority Data

Aug. 12, 2010 (TW) .................................. 99126835

(51) Int. Cl.
*H01L 33/00* (2010.01)

(52) U.S. Cl. .................................. 257/98; 257/E33.068
(58) Field of Classification Search .................. 257/79, 257/98, 99, 678, 701, 706, 712, 718, 719, 257/720, E33.001; 438/22, 23, 24, 25, 26, 438/27, 28, 29, 30, 31, 32, 106, 116
See application file for complete search history.

(56) References Cited

U.S. PATENT DOCUMENTS

| 6,274,924 B1 * | 8/2001 | Carey et al. | 257/676 |
| 2002/0124615 A1 * | 9/2002 | Beeck et al. | 72/112 |
| 2007/0045649 A1 * | 3/2007 | Chen | 257/99 |

* cited by examiner

*Primary Examiner* — Ha Tran T Nguyen
*Assistant Examiner* — Kevin Quinto
(74) *Attorney, Agent, or Firm* — Altis Law Group, Inc.

(57) ABSTRACT

A LED package includes a substrate, at least one LED chip, a transparent adhesive and a lens. The at least one LED chip is mounted on the substrate. The transparent adhesive is filled between the LED chip and the lens. A number of through holes is regularly defined in an optical non-effective portion of the lens. The through holes are configured for increasing the air convection between inside and outside of the lens.

9 Claims, 3 Drawing Sheets

LED PACKAGE

BACKGROUND

1. Technical Field

The disclosure relates generally to semiconductor devices and more particularly to a LED package with heat dissipation devices.

2. Description of the Related Art

In a LED package, the heat generated by the LED chip is normally dissipated by a substrate that the LED chip is mounted on. An optical element of the LED chip is not helpful for heat dissipation. Thus, what is called for is a LED package utilizing an optical element with heat dissipation devices that can alleviate the limitations described.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout two views.

DETAILED DESCRIPTION

The disclosure is illustrated by way of example and not by way of limitation in the figures of the accompanying drawings. It should be noted that references to "an" or "one" embodiment in this disclosure are not necessarily to the same embodiment, and such references mean at least one.

Figure 1:
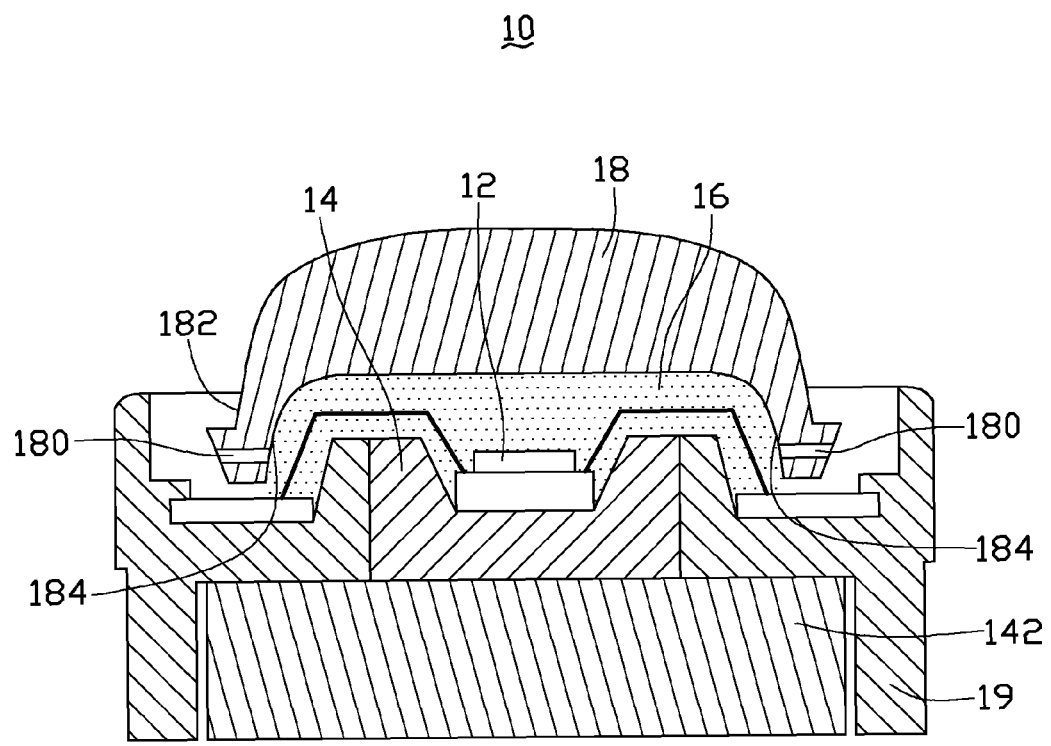
FIG. 1 is a cross-section of a LED package in accordance with one embodiment of the disclosure.
Figure 2:
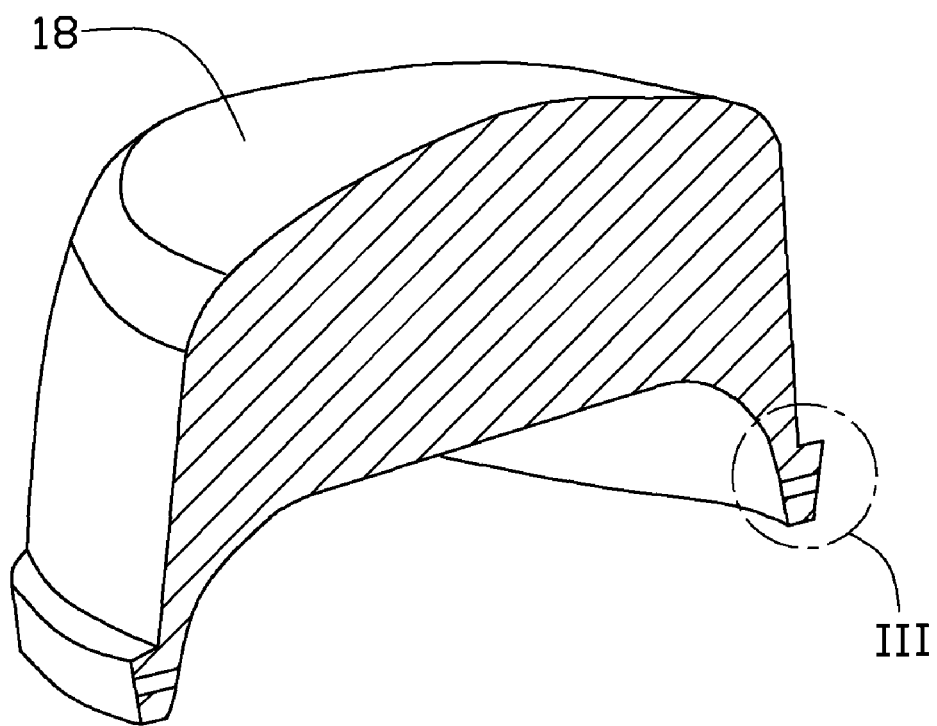
FIG. 2 is a perspective, cross-sectional view of a lens of the LED package in FIG. 1.
Figure 3:
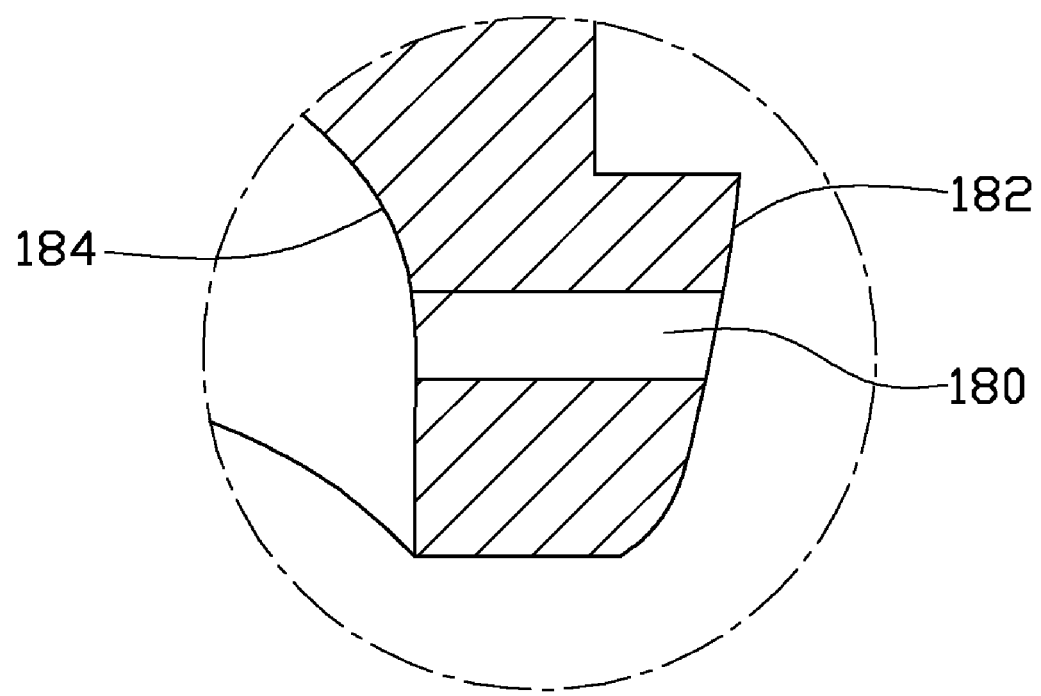
FIG. 3 is an enlarged view of a circled portion of a bottom fringe of the lens of FIG. 2.

Referring to FIGS. 1-2, a LED package 10 in accordance with one embodiment of the disclosure includes a LED chip 12, a substrate 14, a transparent adhesive 16 and a lens 18.

The LED chip 12 is mounted on the substrate 14. The heat generated by the LED chip 12 is transferred to the substrate 14. The substrate 14 is mounted on a plurality of cooling fins 142 for dissipation of the heat. A frame 19 supports the substrate 14 and the cooling fins 142 therein. The transparent adhesive 16 is filled between the LED chip 12 and the lens 18. Light generated by the LED chip 14 travels out of the LED package 10 first through the transparent adhesive 16 and then the lens 18. A number of through holes 180 is defined in an optical non-effective area of the lens 18. In the embodiment, the through holes 180 are defined in the bottom fringe of the lens 18. The through holes 180 penetrate an inner surface 184 and an exterior surface 182 of the lens 18. The through holes 180 are configured for increasing air convection between inside and outside of the lens 18.

The through holes 180 are regularly defined in the bottom fringe of the lens 18. The through holes 180 can be micrometer-scaled or nanometer-scaled. Optimally, the number of the through holes 180 is 3 to 20 when the through holes 180 are micrometer-scaled. The maximum of the through holes is 25 when the through holes 180 are micrometer-scaled.

When the through holes 180 are nanometer-scaled, the number of the through holes 180 can be increased to exceed 25.

In operation, the heat generated by the LED chip 12 can be dissipated by the substrate 14 and the air convection caused by the through holes 180. Thus, the heat dissipation efficiency of the LED package 10 can increase effectively.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A LED package comprising:
   a substrate;
   at least one LED chip mounted on the substrate;
   a transparent adhesive; and
   a lens over the at least one LED chip, the transparent adhesive filled between the at least one LED chip and the lens, wherein a plurality of through holes is regularly defined in an optical non-effective portion of the lens, the through holes configured for increasing the air convection between inside and outside of the lens, light generated by the at least one LED chip travelling out of the LED package first through the transparent adhesive and then the lens.

2. The LED package as claimed in claim 1, wherein the through holes are defined in a bottom fringe of the lens.

3. The LED package as claimed in claim 1, wherein the through holes penetrate an inner surface and an exterior surface of the lens.

4. The LED package as claimed in claim 1, wherein the through holes are micrometer-scaled.

5. The LED package as claimed in claim 4, wherein the number of the through holes does not exceed 25.

6. The LED package as claimed in claim 1, wherein the through holes are nanometer-scaled.

7. The LED package as claimed in claim 6, wherein the number of the through holes exceeds 25.

8. The LED package as claimed in clam 1, wherein a plurality of cooling fins extends downwardly from a bottom of the substrate.

9. The LED package as claimed in claim 8 further comprising a frame receiving the substrate and the cooling fins therein.

* * * * *